United States Patent [19]

Arraut et al.

[11] Patent Number: 4,949,149
[45] Date of Patent: Aug. 14, 1990

[54] SEMICUSTOM CHIP WHOSE LOGIC CELLS HAVE NARROW TOPS AND WIDE BOTTOMS

[75] Inventors: Fernando W. Arraut, San Diego; Laszlo V. Gal, Poway; Robert C. H. Shen, San Diego, all of Calif.

[73] Assignee: Unisys Corporation, Blue Bell, Pa.

[21] Appl. No.: 32,353

[22] Filed: Mar. 31, 1987

[51] Int. Cl.[5] ............... H01L 27/10; H01L 27/02; H01L 29/72
[52] U.S. Cl. ........................ 357/45; 357/35; 357/40; 357/41
[58] Field of Search ............ 357/45, 40, 41, 56, 357/35

[56] References Cited

U.S. PATENT DOCUMENTS

| | | | |
|---|---|---|---|
| 4,006,492 | 2/1977 | Eichelberger et al. | 357/45 |
| 4,381,201 | 4/1983 | Sakurai | 357/91 |
| 4,500,905 | 2/1985 | Shibata | 357/40 |
| 4,589,007 | 5/1986 | Kuboki et al. | 357/41 |
| 4,644,382 | 2/1987 | Charransol et al. | 357/45 |
| 4,646,266 | 2/1987 | Ovshinsky et al. | 357/45 |

FOREIGN PATENT DOCUMENTS 60-16443   1/1985   Japan ........................... 357/45 M

*Primary Examiner*—Andrew J. James
*Assistant Examiner*—Ngan V. Ngo
*Attorney, Agent, or Firm*—Charles J. Fassbender; Robert S. Bramson

[57] ABSTRACT

A logic cell, for use in a semicustom chip, is comprised of a plurality of transistors that are integrated into a semiconductor substrate and are interconnected within the cell to perform a logic function. This cell has sidewalls which define the space in the chip which contains all the transistors and their interconnections within the cell; at least one of the sidewalls is shaped to include a step which gives the cell a narrow top and a wide bottom; and one or more of the cell's transistors lies below the step in the wide bottom of the cell. Many of these cells are arranged in spaced apart rows on the semicustom chip in which the narrow tops of the cell line up. Conductors which interconnect the cells are disposed in the space between the narrow tops of the cells and over the transistors in the wide bottoms of the cells. Using this architecture, the density with which a logic cell is integrated to a semicustom chip is improved more than 100%.

13 Claims, 7 Drawing Sheets

SEMICUSTOM CHIP WHOSE LOGIC CELLS HAVE NARROW TOPS AND WIDE BOTTOMS

BACKGROUND OF THE INVENTION

This invention relates to semicustom integrated circuit chips; and more particularly, it relates to ways and means for improving the density with which logic cells are integrated into such chips.

Basically, in a semicustom integrated circuit chip, a plurality of logic cells are arranged in rows which are spaced apart from one another to form channels for interconnecting the cells. Typically, the number of cells per row and the number of rows per chip varies between 20 and 200. Each of the cells is selected from a cell library which contains many different cell types, each of which performs a different logic function. For example, one cell may be a two input NAND gate; another cell may be a four input NOR gate; another cell may be a flip-flop; etc. These cells are selectively interconnected by one set of conductors which lie in the channels parallel to the rows, and another set of conductors which overlie the cells and run perpendicular to the channels.

Each of the cells of the prior art occupies a rectangular shaped surface area of the chip; and the perimeter of this rectangle is formed by the cell's sidewalls which penetrate the chip and lie perpendicular to its surface. These sidewalls define a space in the chip which contains all the transistors and their connections within the cell.

A recent article which illustrates some CMOS logic cells of the above type, as well as their arrangement in spaced apart rows, is "A Spatial Reasoning Approach to Cell Layout Generation" by Mark Alexander, *Proceedings of the IEEE* 1986 *Custom Integrated Circuits Conference* (CICC) at page 359. Another recent article which illustrates some bipolar logic cells of the above type is "A Sub 10 ns Low Power Bipolar 16×16 Bit Multiplier" by Bruce E. Miller and Robert F. Owen, *Proceedings of the IEEE* 1986 *Custom Integrated Circuits Conference* (CICC), at page 99.

In designing a logic cell, one of the most important considerations is to physically lay out the various transistors and their interconnections within the cell such that a minimal amount of chip space is occupied. This is because system designers are always trying to get more and more logic cells on a chip. Consequently, an enormous amount of effort is made by semicustom chip manufacturers to reduce the size of the cells in their cell library.

One way to reduce the size of a logic cell is to use smaller dimensions for the transistors and interconnections which occur within the cell. However, the amount by which the size of a logic cell can be reduced by this approach is reaching a point of diminishing returns. This is because the photolithographic processes by which transistors and their interconnections are patterned are already very refined and are being pressed to their limits.

Accordingly, a primary object of the invention is to provide an entirely different means by which cell size can be decreased dramatically without further pushing the limits of today's lithographic technology.

BRIEF SUMMARY OF THE INVENTION

In accordance with the present invention, a logic cell, for use in a semicustom chip, is comprised of: a plurality of transistors that are integrated into a semiconductor substrate and are interconnected within the cell to perform a logic function. This cell has sidewalls which define the space in the chip which contains all the transistors and their interconnections within the cell; and at least one of those sidewalls is shaped to include a step which gives the cell a narrow top and a wide bottom. One or more of the cell's transistors lies partially or entirely below the step in the wide bottom of the cell. Many of these cells are arranged in spaced apart rows on the semicustom chip in which the narrow tops of the cell line up. Conductors which interconnect the cells are disposed in the space between the narrow tops of the cells and over the transistors in the wide bottoms of the cells. Using this architecture, the density with which a logic cell is integrated to a semicustom chip is improved by more than 100%.

BRIEF DESCRIPTION OF THE DRAWINGS

Various embodiments of the invention are described in the Detailed Description in conjunction with the accompanying drawings wherein.

DETAILED DESCRIPTION OF THE INVENTION

Figure 1:
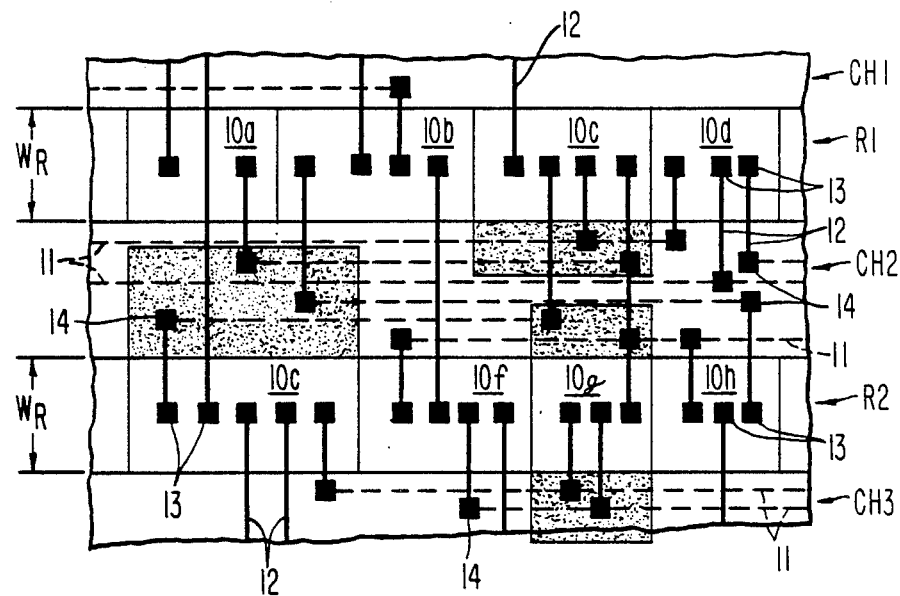
FIG. 1 illustrates a portion of two rows of cells in a semicustom chip which is constructed according to the invention.

Referring now to FIG. 1, reference numerals 10*a* thru 10*h* indicate the outline of respective logic cells as they are arranged on the surface of a semicustom chip that is constructed according to the invention. Each cell contains several transistors which are connected within the cell to form a logic gate or flip-flop. Cells 10*a*, 10*b*, 10*c* and 10*d* are arranged in one row R1 of width $W_R$; while cells 10*e*, 10*f*, 10*g* and 10*h* are arranged in another row R2 of width $W_R$. These rows are spaced apart from one another; and the space between these rows, in the upper layers of the chip, forms respective channels CH1, CH2, and CH3 for interconnecting the cells.

One set of conductors 11 lies in the channels and runs parallel to the rows; whereas another set of conductors 12 overlies the conductors 11 and runs perpendicular to the channels. Contacts 13 selectively connect the input and output terminals of the cells to the conductors 12; and contacts 14 selectively connect the conductors 12 to the conductors 11.

Now in accordance with the present invention, some of the cells have stepped sidewalls which extend beneath the channels. In FIG. 1, cell 10c extends beneath channel CH2; cell 10e extends beneath channel CH2; and cell 10g extends beneath channel CH2 and CH3. Each portion of a cell which extends beneath a channel is patterned in FIG. 1 with a plurality of dots.

Figure 2:
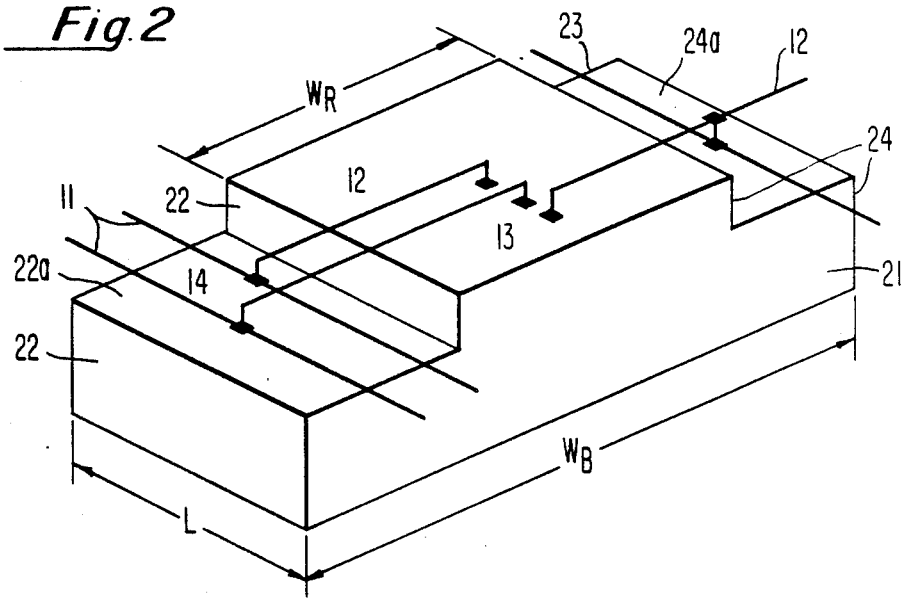
FIG. 2 illustrates one of the cells in the chip of FIG. 1 which has two sidewalls that are shaped to include a step which gives the cell a narrow top and wide bottom.

An isometric view of cell 10g is illustrated in FIG. 2. This cell has four sidewalls 21, 22, 23 and 24 which define the space in the chip that contains all of the transistors and interconnections within the cell. Sidewalls 21 and 23 are substantially perpendicular to the surface of the chip; whereas sidewalls 22 and 24 include respective steps 22a and 24a which run parallel to the surface of the chip. These steps give the cell a top of width $W_R$ which lies entirely between the channels, and a bottom of width $W_B$ which is much larger than $W_R$ so that the bottom extends below the channels.

In one preferred embodiment of the cell, the wide bottom contains a portion of the semiconductor substrate, doped regions in the substrate such as those which form source and drain regions, an insulating layer over the substrate, and a patterned polysilicon layer over the insulating layer. All of the transistors of the cell along with at least some of their internal interconnections are formed by these members. Lying in the cell's narrow top is an insulating layer over the polysilicon, a first patterned metal layer on that insulating layer, and an insulating layer on the first metal layer. This metal layer completes any remaining interconnections of the transistors within the cell; and it also extends outside of the cell to form the conductors 11. A second patterned metal layer lies on an insulating layer over the first metal layer to form the conductors 12.

Figure 3:
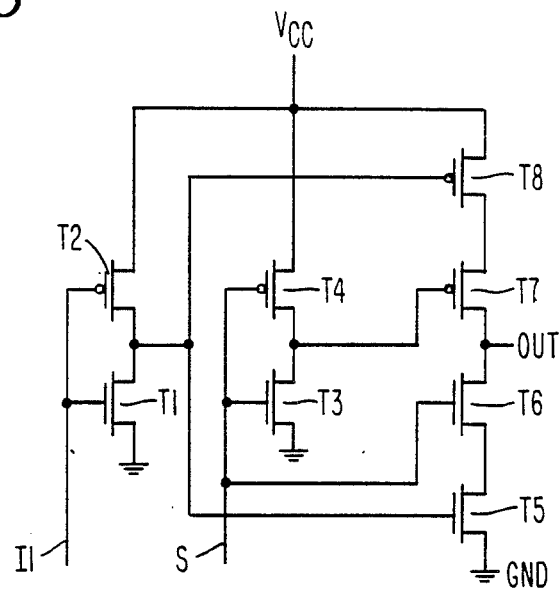
FIG. 3 is a detailed circuit diagram of a logic gate which can be physically laid out with the shape of the cell of FIG. 2.
Figure 4:
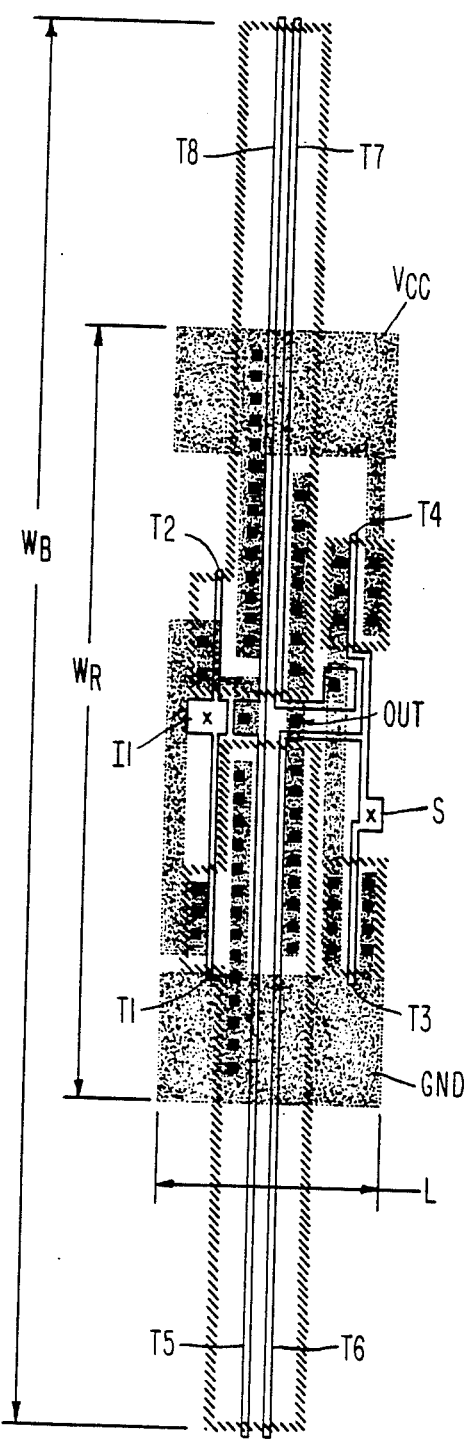
FIG. 4 is a physical layout for the gate of FIG. 3 which has the shape of the cell of FIG. 2.

Turning now to FIGS. 3 and 4, they respectively show a detailed circuit diagram and a physical layout for a tri-state buffer which has the cell structure of FIG. 2. In this buffer there are eight transistors which are indicated by reference numerals T1 thru T8. These transistors are interconnected as illustrated to form the tri-state buffer. Signal I1 is one input signal to the buffer; signal OUT is the output signal from the buffer; and signal TS is another input signal which, when it is low, places the buffer in a tri-state.

In FIG. 4, each of the transistors T1 thru T8 is formed by a polysilicon gate which lies on an insulating layer over a doped region in a semiconductor substrate. Outlines of the doped regions are indicated by slanted spaced lines, and outlines of the polysilicon are indicated by solid lines. Metal lines, which are indicated by a pattern of dots, interconnect the transistors T1 thru T8. All of the transistors lie in the cell's wide bottom, and all of the metal lines lie in the cell's narrow top.

In the gate of FIGS. 3 and 4, transistors T1 thru T4 are relatively small since the loads which they drive are all internal to the gate. By comparison, transistors T5 thru T8 are relatively large since the loads which they drive are external to the gate. FIG. 4 is drawn to scale wherein one millimeter in the drawing equals one micrometer (um) in the actual logic cell. Gates of the smaller transistors are 1um long and 16um wide; while the gates of the larger transistors are 1um long and 115um wide.

These 115um wide gates for the large transistors T5–T8 cause the sidewalls for the wide bottom portion of the cell to have a width $W_B$ of 230um. By comparison, the sidewalls of the narrow top of the cell have a width $W_R$ which is only 130um. Thus the total distance by which this cell extends beneath the channels for the conductors 11 is $W_B$ minus $W_R$ or 100um.

Figure 5:
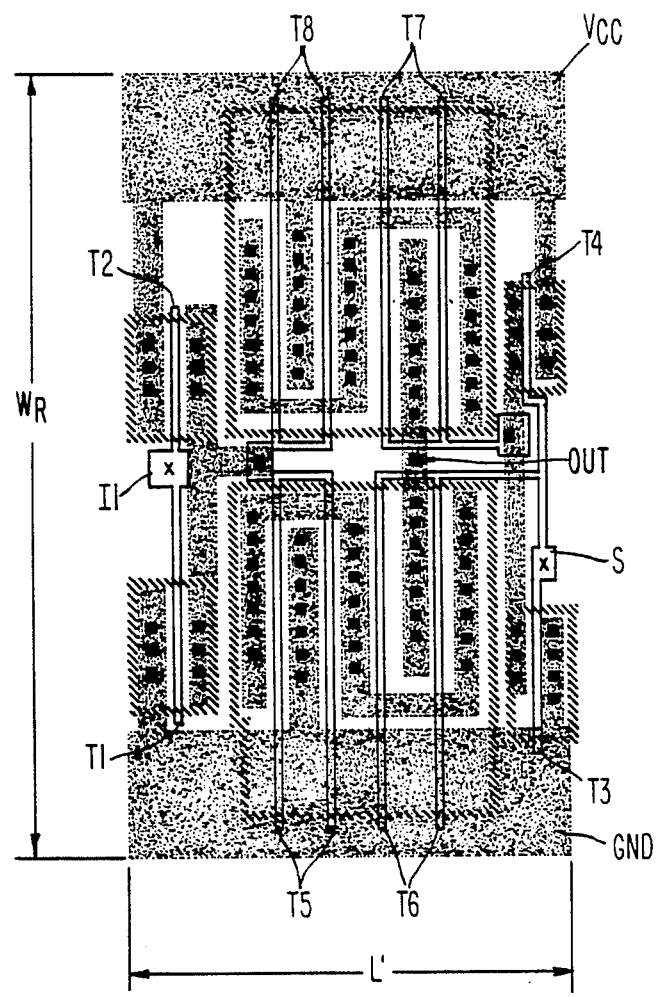
FIG. 5 is a physical layout for the gate of FIG. 3 which, for comparison purposes, is shaped with only vertical sidewalls in accordance with the prior art.

For comparison purposes, FIG. 5 shows a physical layout for the gate of FIG. 3 in which all of the cell's sidewalls are vertical in accordance with the prior art, and so none of the cell's transistors extend beneath the channels. All of the various components of the FIG. 5 cell are notated in the same fashion as the FIG. 4 cell. Also, the cells of FIGS. 4 and 5 are drawn at the same scale.

In the FIG. 5 layout, the width $W_R$ of the cell is the same as the width $W_R$ of the FIG. 4 cell. However, in order for the FIG. 5 cell to accommodate the large transistors T5–T8, its length L' must be much longer than the length L of the FIG. 4 cell.

Specifically, length L of the FIG. 4 cell is 37um; whereas length L' of the FIG. 5 cell is 75um. Thus, in this particular case, the percent savings of chip space is (75um−37um)/(37um) or 102%.

Figure 6:
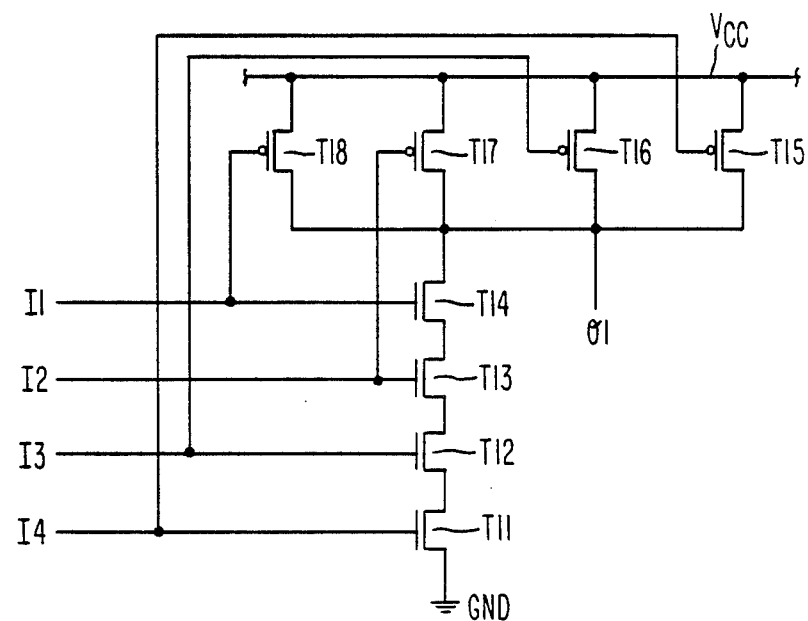
FIG. 6 is a detailed circuit diagram of a second logic gate.
Figure 7:
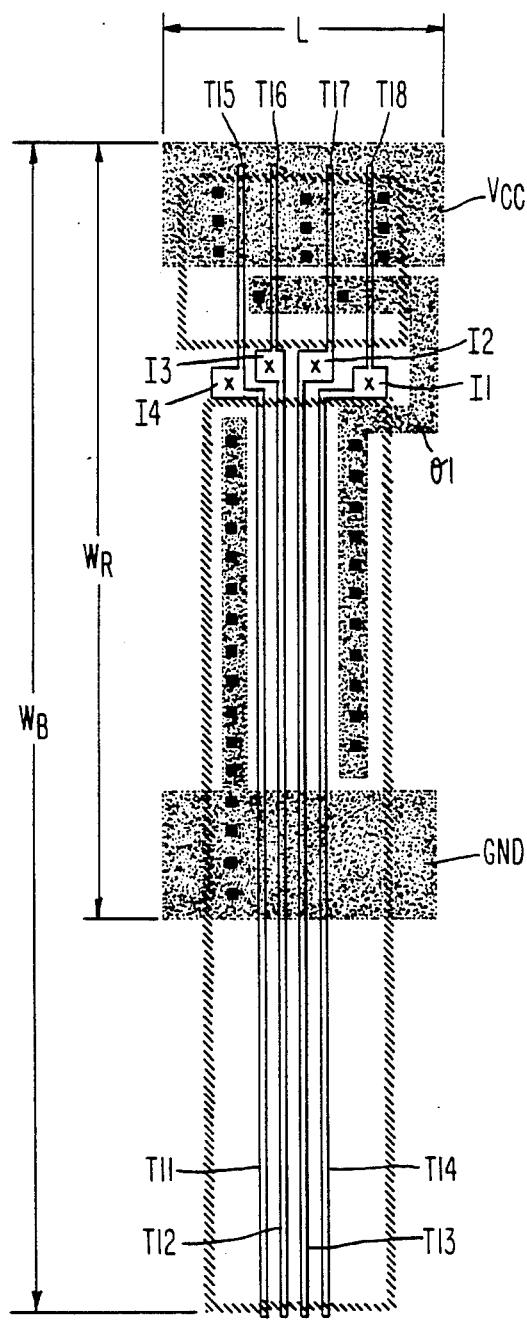
FIG. 7 is a physical layout for the gate of FIG. 6 which is shaped to include just one sidewall with a step in accordance with the present invention.

Turning now to FIGS. 6 and 7, another logic cell which is constructed according to the invention will be described. This cell contains a four input NAND gate which consists of transistors T11 thru T15 and their interconnections as illustrated. Input signals to this gate are labeled I1 thru I4, and the NAND output signal from the gate is labeled OUT. Component notation and scaling in FIG. 7 is the same as that of FIGS. 4 and 5.

In the physical layout of FIG. 7, only one of the sidewalls of the cell includes a step to give the cell a narrow top and wide bottom. Symbol $W_R$ in FIG. 7 indicates the width of the cell's narrow top, and symbol $W_B$ indicates the width of the cell's wide bottom. That portion of the cell which lies outside of width $W_R$ but inside of width $W_B$ is below the step of the cell's stepped sidewall.

Each transistor in FIG. 7 is formed by a polysilicon gate which lies on an insulating layer over a doped region in the semiconductor substrate. Inspection of FIG. 7 shows that the gates of transistors T11 thru T14 are much wider than the gates of transistors T15 thru T18. This is because the transistors T11 thru T14 are interconnected in series to perform the NAND function, and so the gates of those transistors must be wide in order to reduce their total series resistance to an acceptable level. Making the wide gates for transistors T11 thru T14 is achieved with a minimal amount of chip space via the present invention by having portions of those transistors extend beneath the cell's stepped sidewall.

Figure 8:
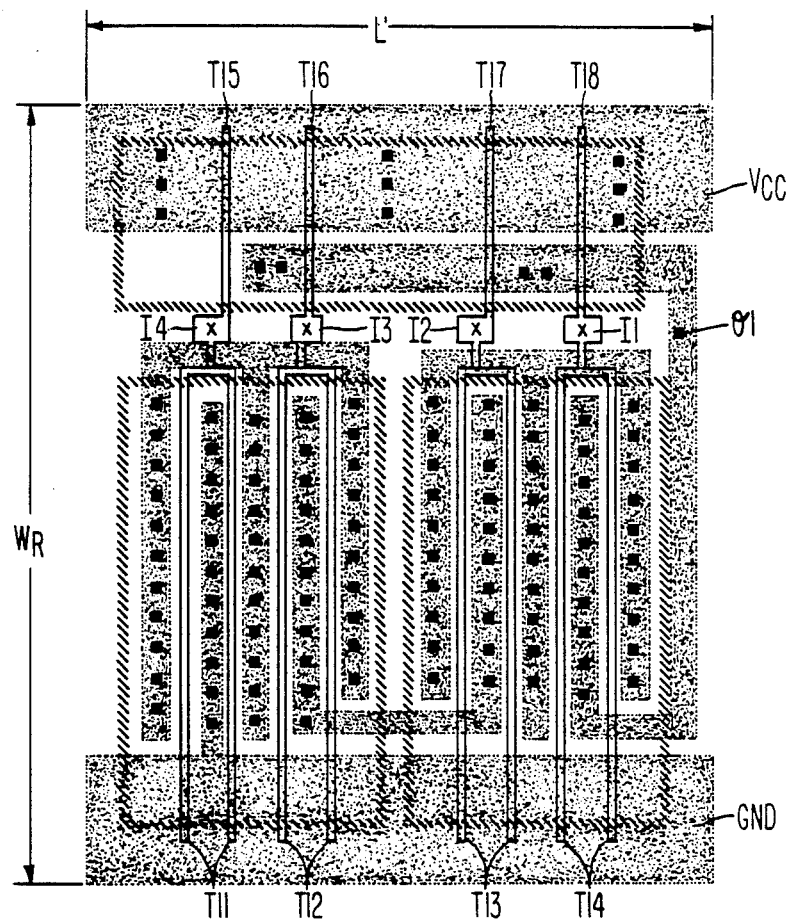
FIG. 8 is a physical layout for the gate of FIG. 6 which, for comparison purposes, is shaped with only vertical sidewalls in accordance with the prior art.

By comparison, FIG. 8 shows the physical layout of the gate of FIG. 6 in which all of the cell's sidewalls are vertical in accordance with the prior art. Here again, the notation and scale is the same as that used in FIG. 7. In the FIG. 8 layout, width $W_R$ is the same as width $W_R$ in the FIG. 7 layout. However, in order to accommodate the large transistors T11 thru T14, the length L' of the FIG. 8 layout is substantially longer than the length L of the FIG. 7 layout. Specifically, length L' is 105um whereas length L is 47um. Thus, in this case, the percent saving of chip space is (105um−47um)/47um or 123%.

Figure 9:
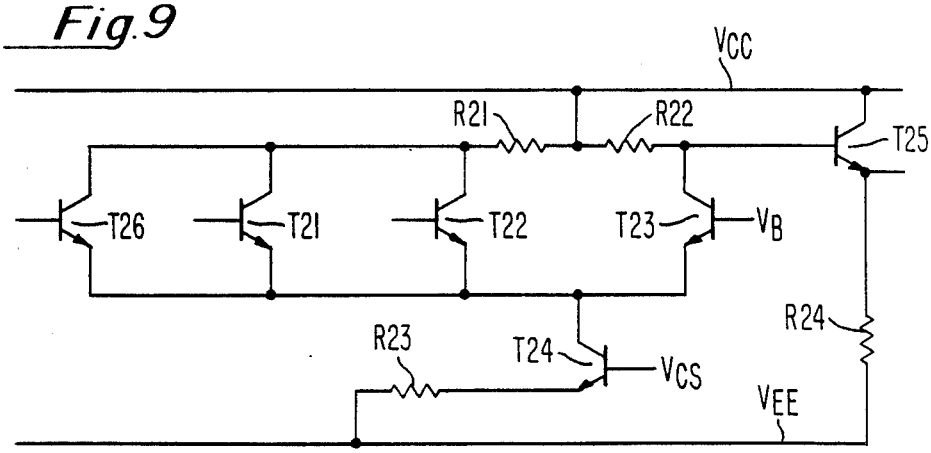
FIG. 9 is a detailed circuit diagram of a third logic gate.
Figure 10:
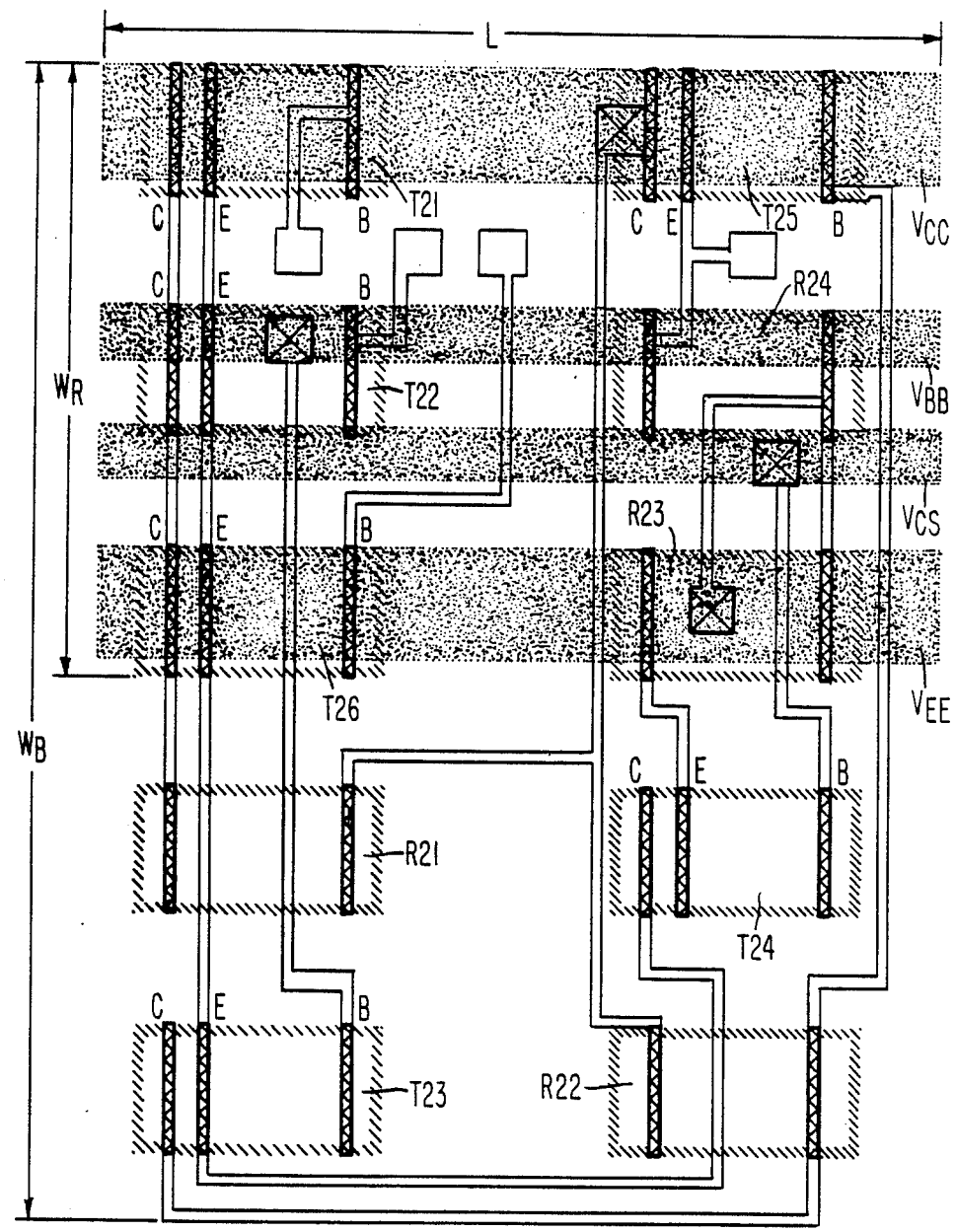
FIG. 10 is a physical layout for the gate of FIG. 9 which is shaped to include transistors that lie entirely below the step of a sidewall in accordance with the invention.

Next, referring to FIGS. 9 and 10, still another logic cell which is constructed according to the invention will be described. This cell is a three input OR gate which consists of six bipolar transistors T21 thru T26, four resistors R21 thru R24, and their interconnections. In FIG. 10, patterned metal lines and polysilicon conductors are notated as in FIGS. 7 and 8; and doped regions in the semiconductor substrate which form the bipolar transistors and resistors are indicated by slanted spaced lines. Each doped region which forms a bipolar transistor has three contacts that are labeled C, E, and B that respectively indicate the collector contact, emitter contact and base contact. Contacts between a doped region and a polysilicon conductor are crosshatched, and contacts between metal and polysilicon are filled with an "x". All components are drawn at the scale of 1mm equals 1um.

FIG. 10 shows that transistors T3 and T4 plus resistors R1 and R2 lie in their entirety below the step of the cell's stepped sidewall. In that figure, symbol $W_R$ indicates the width of the cell's narrow top, and symbol $W_B$ indicates the width of the cell's wide bottom. Components which lie outside of width $W_R$ but within width $W_B$ are below the sidewall's step.

If the cell of FIG. 10 did not have a stepped sidewall, then the length L of the cell would have to be increased in order to accommodate the components R1, R2, T3, and T4. To do that, two more columns of doped regions would need to be added to the cell; and consequently, the cell's chip space would increase by about 100%.

Various preferred embodiments of the invention have now been described in detail. In addition, however, many changes and modifications can be made to these embodiments without departing from the nature and spirit of the invention. Accordingly, it is to be understood that the invention is not limited to these details but is defined by the appended claims.

What is claimed is:

1. A semicustom chip which is comprised of:
    a plurality of logic cells that are integrated into a single semiconductor substrate;
    each of said cells containing input terminals, an output terminal, and transistors which are interconnected within the cell to generate an output signal on said output terminal as a logical function of input signals on said input terminals; and
    said cells being arranged in rows which are spaced apart from each other; wherein
    some of said cells have step-shaped sidewalls that form respective cell tops of a width $W_R$ which are aligned in said rows, and form respective cell bottoms which due to said step are substantially wider than said width $W_R$;
    conductors, lying in a plane in the space between said rows over said step in said wide cell bottoms, which carry signals between said terminals of said cells; and
    said wide cell bottoms containing transistors for their corresponding logic cells and extending those transistors parallel to said plane beneath said conductors.

2. A semicustom chip according to claim 1 wherein some of said wide cell bottoms are at least 20% wider than said width $W_R$.

3. A semicustom chip according to claim 2 wherein some of said cells have two oppositely facing stepped sidewalls that contain transistors which extend beneath said conductors in the space adjacent of the respective row in which those cells lie.

4. A semicustom chip according to claim 2 wherein some of said wide cell bottoms contain transistors which lie in their entirety beneath said conductors in the space between said rows.

5. A semicustom chip according to claim 2 wherein said conductors between said rows are patterned metal lines which lie on an insulating layer over said transistors.

6. A semicustom chip according to claim 2 wherein said transistors are field effect transistors.

7. A semicustom chip according to claim 2 wherein said transistors are bipolar transistors.

8. A logic cell, for use in a semicustom chip, which is comprised of:
    a plurality of transistors that are integrated into a single semiconductor substrate and are interconnected within said cell to perform a logic function;
    said cell having sidewalls which define a space in said chip which contains all of said transistors and their intracell connections;
    at least one of said sidewalls being shaped to include a step which gives said cell a narrow top and a wide bottom which is at least 40% wider than said top; and
    at least one of said transistors lying below said step in the wide bottom of said cell.

9. A logic cell according to claim 8 wherein two of said sidewalls are each shaped to include a step, and respective transistors lie below both steps in the wide bottom of said cell.

10. A logic cell according to claim 8 wherein said wide bottom of said cell includes doped regions in said semiconductor substrate.

11. A logic cell according to claim 8 wherein at least one of said transistors lies in its entirety below said step in the wide bottom of said cell.

12. A logic cell according to claim 8 wherein said transistors are field effect transistors.

13. A logic cell according to claim 8 wherein said transistors are bipolar transistors.

* * * * *